(12) United States Patent
Warnes

(10) Patent No.: US 11,502,593 B2
(45) Date of Patent: Nov. 15, 2022

(54) ADJUSTABLE POWER SUPPLY DEVICE FOR SUPPLYING POWER TO A POWER SWITCH CONTROL DEVICE

(71) Applicant: Murata Manufacturing Co., Ltd., Nagaokakyo (JP)

(72) Inventor: Frank Warnes, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/783,705

(22) Filed: Feb. 6, 2020

(65) Prior Publication Data

US 2020/0177087 A1 Jun. 4, 2020

Related U.S. Application Data

(63) Continuation of application No. PCT/GB2018/052252, filed on Aug. 7, 2018.

(30) Foreign Application Priority Data

Aug. 7, 2017 (GB) ..................... 1712666

(51) Int. Cl.
*H02M 1/08* (2006.01)
*H02M 3/335* (2006.01)

(52) U.S. Cl.
CPC ......... *H02M 1/08* (2013.01); *H02M 3/33523* (2013.01); *H02M 3/33553* (2013.01)

(58) Field of Classification Search
CPC . H02M 2001/0006; H02M 2001/0025; H02M 2001/0083; H02M 2001/009; H02M 1/08; H02M 1/096; H02M 3/335; H02M 3/33561; H02M 3/33523

See application file for complete search history.

(56) References Cited

U.S. PATENT DOCUMENTS

| | | | | |
|---|---|---|---|---|
| 4,334,263 A * | 6/1982 | Adachi | ............... | H02M 3/3372 363/25 |
| 4,581,690 A * | 4/1986 | Russell | ............. | H02M 3/33561 363/101 |
| 5,438,294 A * | 8/1995 | Smith | ...................... | H02M 1/08 327/384 |
| 5,920,472 A * | 7/1999 | Bijlenga | .................. | H02M 1/08 363/97 |
| 6,434,027 B1 * | 8/2002 | Sano | ........................ | H02M 3/07 363/21.16 |
| 8,284,575 B2 * | 10/2012 | Inamura | ............... | H03K 17/691 363/21.16 |

(Continued)

OTHER PUBLICATIONS

Official Communication issued in International Patent Application No. PCT/GB2018/052252, dated Nov. 6, 2018.

(Continued)

*Primary Examiner* — Gustavo A Rosario-Benitez
(74) *Attorney, Agent, or Firm* — Keating & Bennett, LLP

(57) ABSTRACT

An adjustable power supply suitable for a power switch driver circuit takes an input voltage and generates output voltages at three output terminals. Two of the output terminals provide gate voltage signals to a power switch control device while the third is connected to a reference voltage. The output voltages may be adjusted using a first and second external resistor enabling power requirements for a wide variety of power switch devices to be satisfied.

19 Claims, 5 Drawing Sheets

(56) References Cited

U.S. PATENT DOCUMENTS

| | | | | |
|---|---|---|---|---|
| 9,601,982 B1* | 3/2017 | Zhang | .................... | H02M 1/08 |
| 9,966,837 B1* | 5/2018 | Seaton | .................... | H02M 1/32 |
| 10,985,662 B2* | 4/2021 | Chung | .............. | H02M 3/33523 |
| 2002/0057583 A1 | 5/2002 | Nishida et al. | | |
| 2012/0008344 A1* | 1/2012 | Zeng | .................. | H03K 17/6877 |
| | | | | 363/21.11 |
| 2014/0177308 A1* | 6/2014 | Morita | .............. | H02M 3/33523 |
| | | | | 363/127 |
| 2014/0376273 A1* | 12/2014 | Hosotani | ................ | H02M 1/36 |
| | | | | 363/21.02 |
| 2019/0341847 A1* | 11/2019 | Yuzurihara | ............ | H02M 1/08 |

OTHER PUBLICATIONS

Linear Technology Corporation, "LTC4441/LTC4441-1, N-Channel MOSFET Gate Driver", https://www.analog.com/media/en/technical-documentation/data-sheets/44411fa.pdf, Mar. 16, 2011, pp. 1-16.

* cited by examiner

ADJUSTABLE POWER SUPPLY DEVICE FOR SUPPLYING POWER TO A POWER SWITCH CONTROL DEVICE

CROSS REFERENCE TO RELATED APPLICATIONS

This application claims priority to United Kingdom Patent Application No. 1712666.5 filed on Aug. 7, 2017 and is a Continuation Application of PCT Application No. PCT/GB2018/052252 filed on Aug. 7, 2018. The entire contents of each application are hereby incorporated by reference.

BACKGROUND OF THE INVENTION

1. Field of the Invention

This application relates to an adjustable power supply circuit for power switch gate drivers, and in particular to an adjustable power supply circuit capable of being used with multiple variants of power switch gate driver circuits.

2. Description of the Related Art

Power electronics devices, such as DC to DC converters and switched mode power supplies, make use of high power transistors to provide a stable output voltage of a predetermined value from a given input power supply. The transistors are switched on and off to regulate the output voltage. Power electronics devices have important applications in switching high currents in uninterruptible power supplies, motor drives, solar inverters, and electric vehicles, and must therefore meet stringent constraints and requirements imposed upon the output voltage they produce. For example, it may not be acceptable for the output voltage to deviate from a nominal value by more than a predetermined tolerance.

Power electronics devices can provide gate drive potential differences to power switch devices. Typically, power switch devices, such as high power transistors, each require a 25 Volt (V) gate drive potential difference. In the commonly recognized industry standard, Isolated Gate Bipolar Transistors require a connection to rails held at +15 V and −10 V; Silicon Carbide transistors require a connection to rails held at +20 V and −5 V; and Metal Oxide Field Effect Transistors require a connection to rails held at +15 V and −5 V.

However, other power switch devices, especially emerging technologies, such as Silicon Carbide (SiC) and Gallium Nitride (GaN), have various different power requirements. This is exaggerated further by the fact that the voltages required at the switch are not necessarily the voltages that are required from the gate drive power supply. This is due to system differences like voltage drops in the driver IC and the need to overcome inductance in the source or emitter connection of the switch. This results in the power supply needing to deliver a slightly higher positive and negative voltage to overcome these voltage drops.

There is therefore a need for a single adjustable power supply that can be used with power electronics applications that require a variety of input voltages.

SUMMARY OF THE INVENTION

A preferred embodiment of the present invention provides an adjustable power supply device for supplying power to a power switch control device configured to provide control signals to a power switch device, the adjustable power supply device including: a pair of input terminals; switching circuitry connected to the pair of input terminals; converter circuitry, the converter circuitry including a pair of intermediate terminals and first, second, and third output terminals that output power to the power switch control device; a transformer including a primary side winding coupled to the pair of input terminals and a secondary side winding coupled to the pair of intermediate terminals, wherein a potential difference generated between the pair of intermediate terminals is divided by a dividing circuit into a first output voltage difference applied across the first and the second output terminals and a second output voltage difference applied across the second and the third output terminals; the converter circuitry including a first adjustment circuit that adjusts the first output voltage difference and second output voltage difference, the first adjustment circuit including at least one external terminal that is coupled to a first resistance element; and the switching circuitry including a second adjustment circuit that adjusts the potential difference generated between the pair of intermediate terminals, the second adjustment circuit including at least one external terminal that is coupled to a second resistance element. The second output terminal is held at a reference voltage. The first output terminal provides the first output voltage difference to a first input of the power switch control device, and the third output terminal provides the second output voltage difference to a second input of the power switch control device.

Optionally, the switching circuitry may further include a switch controller coupled to a switch and coupled to the primary side winding to control a current flowing through the primary side winding.

Optionally, one of the at least one external terminals of the second adjustment circuit may be coupled to the switch controller.

Optionally, one of the at least one external terminals of the second adjustment circuit may be coupled to a voltage feedback pin of the switch controller.

Optionally, the voltage feedback pin of the switch controller may be coupled to a primary side feedback winding.

Optionally, the second adjustment circuit may include a switching circuit voltage divider including at least a first resistor connected between the voltage feedback pin and the primary side feedback winding, and a second resistor connected between the voltage feedback pin and ground wherein the voltage feedback pin of the switch controller is connected to the switching circuit voltage divider.

Optionally, the second adjustment circuit may include a pair of external terminals that is coupled to a pair of corresponding external connections configured to receive the first resistance element therebetween, one of the pair of external terminals is coupled to ground, and the first resistance element, when connected between the pair of corresponding external connections, is coupled via the pair of external terminals of the second adjustment circuit in parallel with a resistor in the switching circuit voltage divider.

Optionally, the second adjustment circuit may adjust the potential difference generated between the pair of intermediate terminals by adjusting the duty cycle of the switch controller.

Optionally, the dividing circuit may include a further resistive element.

Optionally, one of the at least one external terminals of the first adjustment circuit may be coupled to the low voltage side of the secondary side winding via one of the pair of intermediate terminals.

Optionally, the first adjustment circuit may include a converter circuitry voltage divider including at least a first resistor and a second resistor connected in parallel between the pair of intermediate terminals.

Optionally, the at least one external terminal of the first adjustment circuit includes a pair of external terminals, and the pair of external terminals of the first adjustment circuit is coupled to a the first adjustment circuit may include a pair of external terminals that is coupled to a pair of external connections configured to receive the second resistance element mounted therebetween.

Optionally, the dividing circuit includes a further resistance element, and one of the pair of external terminals may be coupled to a divider circuit and to the high voltage side of the secondary side winding via the other of the pair of intermediate terminals and the converter circuitry voltage divider, such that the first resistance element is coupled to the further resistance element of the dividing circuit.

Optionally, the further resistance element may be a transistor.

Optionally, the other of the pair of external terminals of the first adjustment circuit may be coupled to the base/gate terminal of the transistor.

Optionally, the transistor may be connected in parallel between the pair of intermediate terminals such that the source/emitter terminal of the transistor is coupled to the high voltage side of the secondary side winding.

Optionally, the further resistance element may include an adjustable voltage drop.

Optionally, a node of the first adjustment circuit may be connected to the further resistance element such that a change in voltage at the node adjusts the voltage dropped across the further resistance element.

Optionally, the first adjustment circuit may adjust the first output voltage difference and the second output voltage difference by adjusting the voltage dropped across the further resistance element.

A preferred embodiment of the present inventions provides a device including: a header on which the switching circuitry, converter circuitry, and transformer are mounted; wherein the pair of input terminals and the at least one external terminals of the first and the second adjustment circuits are connections on the external surface of the header that connect with a third party circuit board.

Optionally, the reference voltage may be the source voltage of the power switch device.

Optionally, the reference voltage may be zero volts.

The above and other features, elements, characteristics, steps, and advantages of the present invention will become more apparent from the following detailed description of preferred embodiments of the present invention with reference to the attached drawings.

DETAILED DESCRIPTION

For the purposes of illustration, a flyback converter is shown in the accompanying figures, however other DC to DC converter configurations, such as a forward converter, for example, would also be acceptable.

Figure 1:
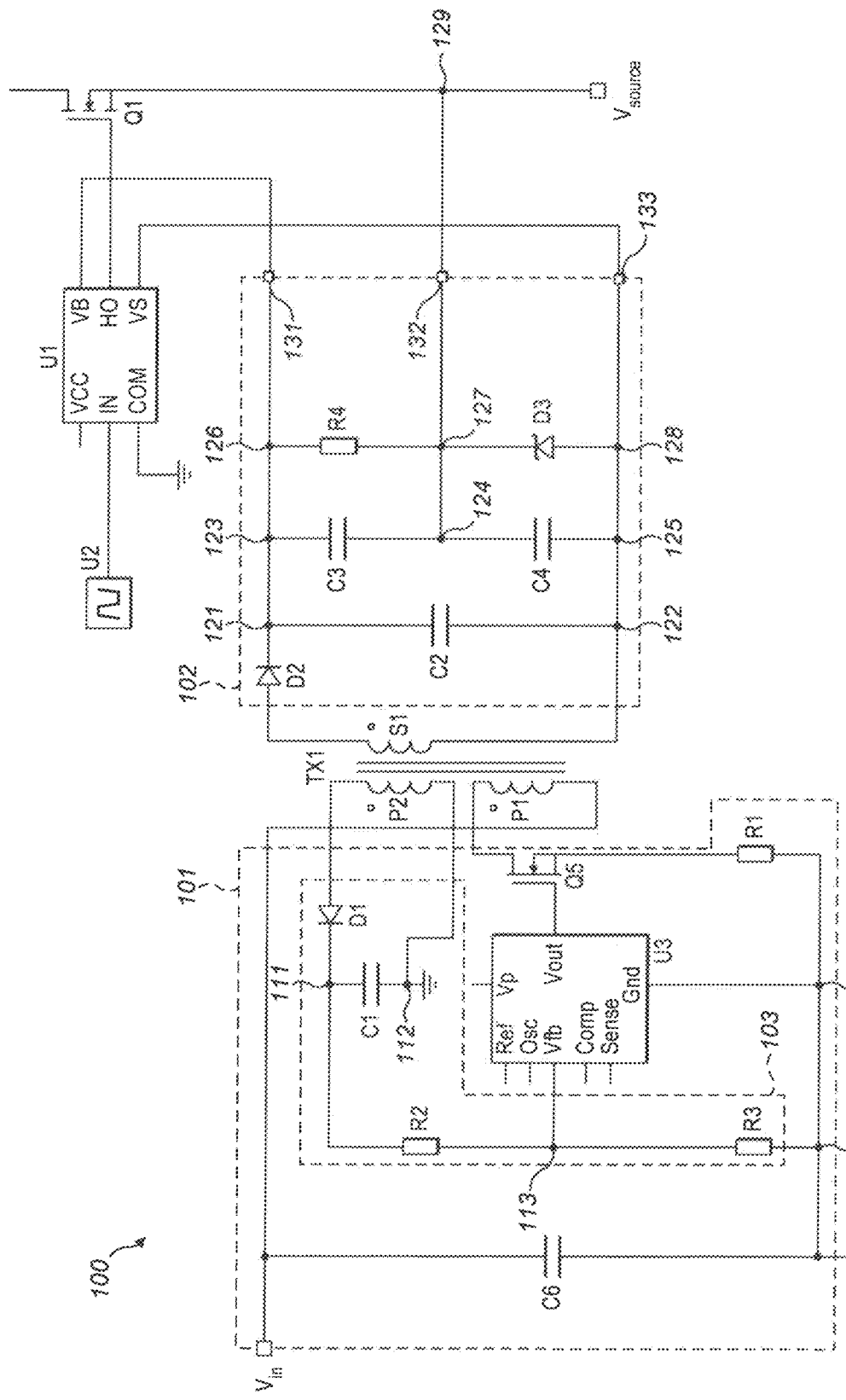
FIG. 1 shows a known DC to DC converter which provides fixed voltages to a gate driver.

FIG. 1 shows a DC to DC converter 100 in a flyback converter configuration. The converter accepts an input voltage Vin relative to a ground voltage and is configured to provide three fixed voltages, for example +20 V, 0 V and −5 V, at output terminals 131, 132 and 133.

The DC to DC converter 100 shown in FIG. 1 includes a transformer TX1, primary-side circuitry connected to a pair of input terminals including an input voltage (Vin) terminal and a ground input terminal, and secondary-side circuitry connected to three output terminals 131, 132 and 133. The primary-side circuitry shown in FIG. 1 includes switching circuitry 101 to periodically control whether a Metal Oxide Field Effect Transistor (MOSFET) Q5 is in a conducting or a non-conducting state. The secondary-side circuitry includes converter circuitry 102 and ensures the potential difference supplied across intermediate terminals 121 and 122 is correctly shared across output terminals 131, 132 and 133.

Transformer TX1 includes transformer primary windings, P1 and P2, and a transformer secondary winding, S1, which are wound around a transformer core. In one preferred embodiment, the transformer core is made of ferrite, however in alternative arrangements it is possible to use other materials for the core, or the core may be absent in which case the windings are air-cored.

Input voltage terminal Vin is connected to the high voltage side of primary winding P1 and the drain of a Metal Oxide Field Effect Transistor (MOSFET) Q5 located in switching circuitry 101 is connected to the low voltage side of primary winding P1. The feedback primary winding P2 is connected to feedback circuitry 103 located on the primary side of transformer TX1 and secondary winding S1 is connected to the converter circuitry 102. A capacitor C6 is connected between input terminals Vin and ground and acts as a short bypass path that provides high peak currents to transistor Q5.

Transistor Q5 includes a drain, source and gate. As indicated above, the drain of transistor Q5 is connected to the low voltage side of primary transformer winding P1. The source of transistor Q5 is connected to ground via a transistor source resistor R1. The gate of transistor Q5 is connected to a Pulse Width Modulation (PWM) switch controller U3 such that transistor Q5 receives gate control signals from PWM switch controller U3.

Feedback primary winding P2 is connected to feedback circuitry 103 located within the switching circuitry 101 and includes a diode D1, a capacitor C1 and a voltage divider circuit R2, R3. Primary winding P2 is connected to the feedback circuitry 103 at nodes 111 and 112. A further node 113 is located at the midpoint of voltage divider circuit R2, R3 and is connected to PWM switch controller U3 such that the voltage at node 113 is provided to an input pin of PWM switch controller U3.

Capacitor C1 is connected between nodes 111 and 112 and acts as a smoothing capacitor as further described below. Node 112 is connected to ground and diode D1 is connected between node 111 and the low voltage side of feedback primary winding P2 such that, when transistor Q5 is turned on, diode D1 is reverse-biased. Voltage divider resistors R2 and R3 are connected in series between node 111 and ground at node 114. Node 113 of the feedback voltage divider is connected to PWM switch controller U3 at the Vfb (voltage feedback) pin.

The PWM switch controller U3 depicted in FIG. 1 includes 8 pins: a positive voltage pin, Vp; a ground voltage pin, Gnd; a feedback voltage pin Vfb; a reference voltage pin, Ref; a comparison voltage pin, Comp; a current sense voltage pin, Sense; an oscillator input pin, Osc; and an output voltage pin, Vout. The PWM switch controller U3 shown in FIG. 1 may be provided as a portion of an integrated circuit (IC) incorporated within the circuitry shown in FIG. 1.

Although not illustrated in FIG. 1, a supply voltage may be provided to the PWM switch controller U3 via input pins Vp and Gnd. The Gnd input pin is connected to ground via node 115. A voltage at node 113 in feedback circuitry 103 is provided to the Vfb pin. Gate control signals produced by U3 are provided to transistor Q5 via the Vout pin. Although the Ref, Osc, Comp and Sense pins are depicted as being disconnected in FIG. 1, it will be appreciated that in some preferred embodiments other components and signals may be provided to these pins.

Turning to the secondary side of transformer TX1, the secondary-side circuitry 102 includes: a diode D2 and a capacitor C2; intermediate terminals 121 and 122; a capacitive voltage divider C3, C4; a resistor and Zener diode voltage divider R4, D3; and output terminals 131, 132 and 133.

Diode D2 is connected between intermediate terminal 121 and the low voltage side of transformer secondary winding S2 such that when transistor Q5 is in a conductive mode, diode D2 is reverse-biased. Capacitor C2 is provided between intermediate terminals 121 and 122 to smooth the voltage applied across intermediate terminals 121 and 122. Thus, diode D2 and capacitor C2 operate as a half-wave rectifier circuit with a smoothing capacitor that provides a DC voltage across intermediate terminals 121 and 122.

The capacitive voltage divider includes capacitors C3 and C4 connected in series across intermediate terminals 121 and 122. As shown in FIG. 1, capacitor C3 is connected to terminal 121 via node 123 and is connected to capacitor C4 via node 124. Similarly, capacitor C4 is connected to terminal 122 via node 125 and to capacitor C3 via node 124.

The secondary-side voltage divider depicted in FIG. 1 includes resistor R4 and Zener diode D3 connected in series across intermediate terminals 121 and 122 via nodes 126 and 128. As shown in FIG. 1, resistor R4 is connected to terminal 121 via nodes 126 and 123 and is connected to Zener diode D3 via node 127. Similarly, Zener diode D3 is connected to terminal 122 via nodes 128 and 125 and to resistor R4 via node 127.

The resistor and Zener diode voltage divider and the capacitive voltage divider are connected between nodes 124 and 127 which results in fixing these nodes at the same potential.

Output terminal 131 is connected to the resistor and Zener diode voltage divider circuit via node 126 and is connected to the capacitive voltage divider circuit via nodes 126 and 123. Output terminal 132 is connected to the resistor and Zener diode voltage divider circuit via node 127 and is connected to the capacitive voltage divider circuit via nodes 127 and 124. Output terminal 132 is also connected to the source of power switch device Q1 via node 129 and is held at a reference voltage, Vsource. In some preferred embodiments, output terminal 132 is held at 0 V so that output terminal 132 acts as a gate drive 0 V reference. Output terminal 133 is connected to the resistor and Zener diode voltage divider circuit via node 128 and is connected to the capacitive voltage divider circuit via nodes 128 and 125.

The voltages produced at output terminals 131, 132 and 133 may be provided to a power switch device, such as transistor Q1, via a power switch control device, for example gate driver integrated circuit (IC) U1.

In FIG. 1, gate driver IC U1 includes: a fixed supply voltage input pin (VCC); a ground input pin (COM) pin; a control input pin (IN) pin that receives a clock signal from clock signal generator U2; an absolute supply voltage input pin (VB) connected to output terminal 131 that receives a first, high, fixed voltage; an offset supply voltage input pin (VS) connected to output terminal 133 that receives a second, low, fixed voltage; and an output voltage pin (HO) that sends gate drive signals to Q1. The IN, VS and VB pins may be connected to logic circuitry to provide gate drive control signals at output pin HO.

A gate driver IC U1 is powered by the potential difference provided by terminals 131 and 133. The gate drive waveform provided to the gate of the power switch device Q1 will vary between a first and second fixed voltage provided by terminals 131 and 133. For example, the gate of the power switch device Q1 may be provided with a signal alternating between +20 V and −5 V. The signal alternates between the first and second fixed voltages in response to a clock signal produced by U2.

The gate driver IC U1 is provided with a first and second fixed voltage signal from the power supply. The first fixed voltage signal may be provided to the VB pin from terminal 131, which in a specific preferred embodiment may be held at a voltage level of +20 V, for example, and the second fixed voltage signal may be provided to the VS pin from terminal 133, which in a specific preferred embodiment may be held at a voltage level of −5 V, for example.

The gate driver IC U1 shown in FIG. 1 may be provided as a portion of an integrated circuit (IC) incorporated within the circuitry shown in FIG. 1. Additionally, it will be appreciated by those skilled in the art that power switch device Q1 may be included in other configurations than shown in FIG. 1. For example, power switch device Q1 may be connected directly to ground, connected in series with a load, or connected in series with another transistor in a half-bridge configuration.

As will be appreciated by persons of ordinary skill in the art, when transistor Q5 is in a conducting state, the input voltage Vin applied across the primary windings of transformer TX1 causes current to flow in the windings and energy is thereby stored in the resulting magnetic field produced by the transformer TX1. Switching Q5 to a non-conductive state induces a voltage across the feedback and secondary transformer windings. Energy stored within the magnetic field is converted to electrical energy which may be used to supply, for example, transistors in switched-mode power supplies or power switch devices.

When transistor Q5 is turned on, an applied voltage Vin drives a current through the transformer primary winding P1, energizing the winding. When the primary winding P1 is energized, the increasing magnetic flux passing through the core of transformer TX1 induces a voltage across feedback primary winding P2 and secondary winding S1. For an ideal transformer, the voltage induced in the secondary and feedback windings is proportional to the number of turns on the secondary and feedback windings and the changing magnetic flux through the windings. The polarity of the transformer windings is such that when primary winding P1 is energized, diodes D1 and D2 are reverse biased resulting in no current flowing through feedback winding P2 and secondary winding S1. Energy is therefore stored in the magnetic field within the transformer until transistor Q5 is switched off.

When the switching circuitry 101 disconnects the primary windings from the input voltage by turning transistor Q5 off, primary winding P1 is no longer energized and the magnetic field within the transformer collapses leading to a rapid decrease in magnetic flux. This rapid decrease in magnetic flux induces a voltage of opposing polarity in the secondary and feedback windings. Hence, when transistor Q5 is turned off diodes D1 and D2 become forward biased resulting in current flowing through windings P2 and S1. Energy stored within the magnetic field is converted to electrical energy and is delivered to intermediate terminals 121 and 122 on the output side and to the Vfb pin on the input side.

Feedback circuitry 103 enables the PWM switch controller U3 to decide whether to increase or decrease the duty cycle of the gate drive pulses. This maintains a constant output voltage across intermediate terminals 121 and 122.

As previously described, diode D1 in the feedback winding becomes forward biased when transistor Q5 is switched off due to a decreasing magnetic flux. Energy stored in the transformer is converted to electrical energy and transferred through the feedback circuit. Smoothing capacitor C1 ensures that the current and voltage are delivered through the feedback circuit at a constant level instead of as a pulse. Thus, diodes D1 and C1 operate as a half-wave rectifier circuit with a smoothing capacitor that provides a DC voltage to node 111. Resistors R2 and R3 act as a voltage divider to provide an appropriate voltage level to switch transistor Vfb pin via node 113.

Since the feedback and secondary coils include a fixed difference between turn ratios, the voltage induced across capacitor C1 is directly proportional to the voltage induced across capacitor C2 and also the intermediate terminals 121 and 122. The use of capacitor C1 and voltage divider R2, R3 therefore provides feedback that is proportional to the output at the secondary side of the transformer without a separate isolated feedback path.

Adjusting the voltage level at node 113 will change the duty cycle of PWM switch controller IC U3, as described below with reference to FIG. 2. The components which also appear in FIG. 1 have been allocated the same numerals.

Figure 2:
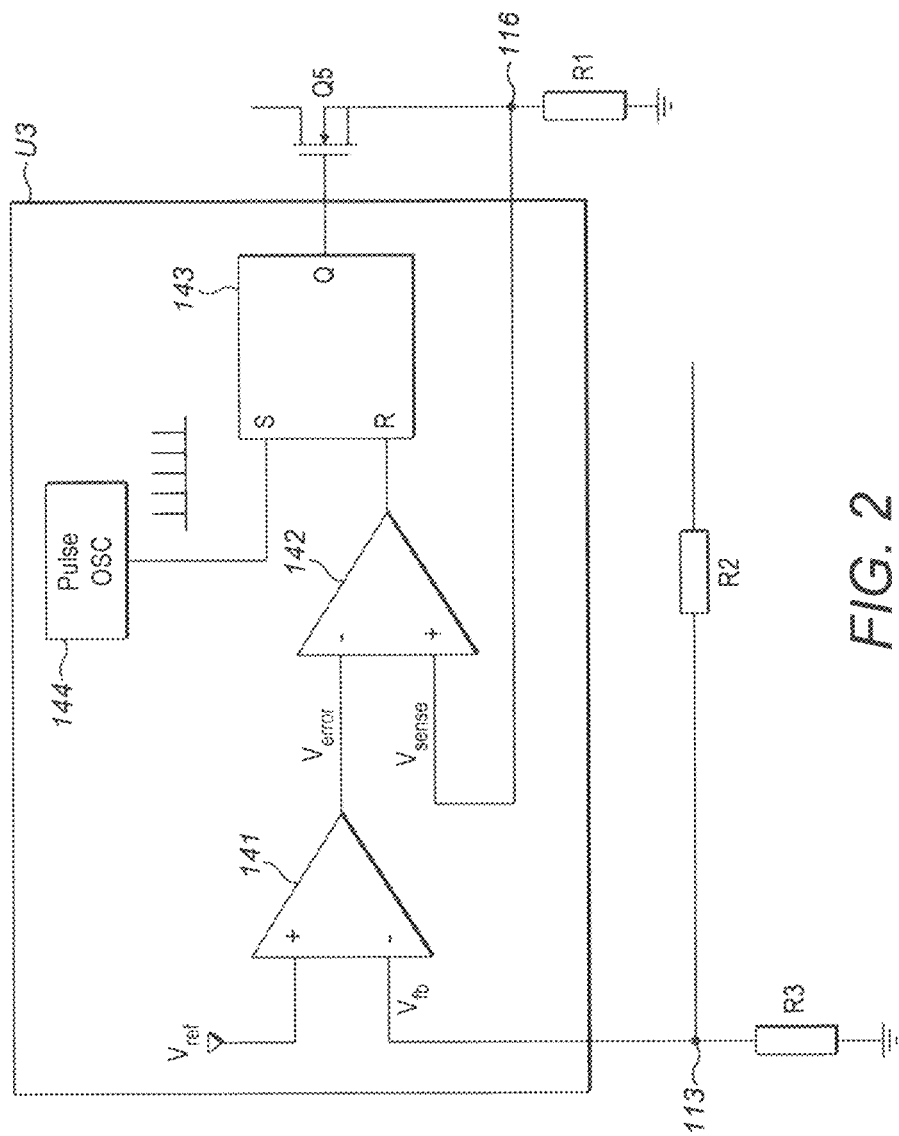
FIG. 2 shows a simplified diagram of a Pulse Width Modulation controller that supplies gate control signals to a transistor.

FIG. 2 depicts a PWM switch controller U3 that provides gate control signals to the gate of transistor Q5. In the example shown in FIG. 2, PWM switch controller IC U3 includes an error amplifier 141, a comparator 142, a Set-Reset (SR) latch 143 and a pulse oscillator 144.

Node 113 of feedback circuitry 103 is connected to the negative input of error amplifier 141 via the Vfb pin (not shown) such that the voltage at node 113 is provided to error amplifier 141 as a feedback voltage. The positive input of error amplifier 141 is connected to a reference voltage Vref and the difference between Vfb and Vref is output as an error signal Verror.

The output of error amplifier 141 is connected to the negative input of comparator 142 and the positive input of comparator 142 is connected to node 116 which is located between the source of Q5 and resistor R1 such that node 116 supplies a voltage Vsense to comparator 142.

The output of the comparator 142 is provided to the reset input R of SR latch 143. The set input S of SR latch 143 is connected to pulse oscillator 144 which provides a signal of a set frequency. The Q output of SR latch 143 is connected to the gate of transistor Q5 via output pin Vout (not shown).

The value of Vsense depends upon the current flowing through transistor Q5. Due to inductive effects in the primary transformer winding P1, when transistor Q5 is switched on the current flowing in the primary winding, and hence the current flowing through transistor Q5, increases linearly. Therefore a linearly increasing voltage, Vsense, is established across R1. When Vsense equals Verror, the output of comparator 142 is high (1). This resets the RS latch and terminates the gate drive pulse. The Q output of RS latch produces the next gate drive signal when the internal oscillator provides a high signal (1) to the set input S of the RS latch.

When the switch duty cycles and circuit capacitances are correctly adjusted, a predetermined and substantially constant voltage is provided between the intermediate terminals 121 and 122. Returning to FIG. 1, as the switching circuitry 101 energizes and de-energizes the windings of transformer TX1, the intermediate terminals 121 and 122 of converter circuitry 102 are alternatively held at a potential by the charge stored in capacitor C2 or by the opposing voltage set up in the secondary winding. Capacitor C2 acts to reduce the variations in the voltage applied across the intermediate terminals 121 and 122 which result from this cycling, providing an output voltage that may be treated as a constant DC output.

Positioning a reverse-biased Zener diode D3 between nodes 127 and 128 results in a near-constant voltage drop across Zener diode D3 if the voltage induced on the secondary winding is greater than the reverse breakdown voltage of the Zener diode D3. Resistor R4 and Zener diode D3 therefore act as a converter circuit voltage divider. It will be appreciated that other resistive components may act as a voltage divider within the converter circuit.

In the capacitive voltage divider, capacitors C3 and C4 are high-frequency capacitors that additionally provide high peak currents to minimize switching losses when power switch device Q1 switches on or off. As the gate of power switch device Q1 includes an associated capacitance, the average current flowing into the gate can be very low. Additional capacitors C3 and C4 therefore provide the additional functionality of providing high peak currents during switching.

Connecting node 127 of the resistive voltage divider to node 124 of the capacitive voltage divider ensures that nodes 124 and 127 are held at the same potential. Likewise, nodes 123 and 126 are held at a first fixed potential and nodes 125 and 128 are held at a second fixed potential.

In the preferred embodiment shown in FIG. 1, nodes 124 and 127 are held at a reference voltage, for example at 0 V. As diode D2 ensures the current in the converter circuit can only flow in one direction, a fixed negative voltage is produced at nodes 125 and 128 and a fixed positive voltage is produced at nodes 123 and 126. The fixed voltage levels produced by the voltage divider configuration may be associated with the voltage levels required by the terminals of a power switch device.

In a specific example, the secondary winding produces a potential difference of 25 V and Zener diode BZX79-5V1 is used, which includes a reverse breakdown voltage of 5.1 V. As terminal 132 is held at 0 V, terminal 133 will be held at approximately −5 V and terminal 131 will be held at approximately +20 V. The voltages produced in this specific example would be suitable in powering a Silicon Carbide transistor.

However, known DC to DC flyback converters as described above cannot be easily adjusted to provide voltage levels suitable for a variety of power switch devices with different power requirements.

Figure 3:
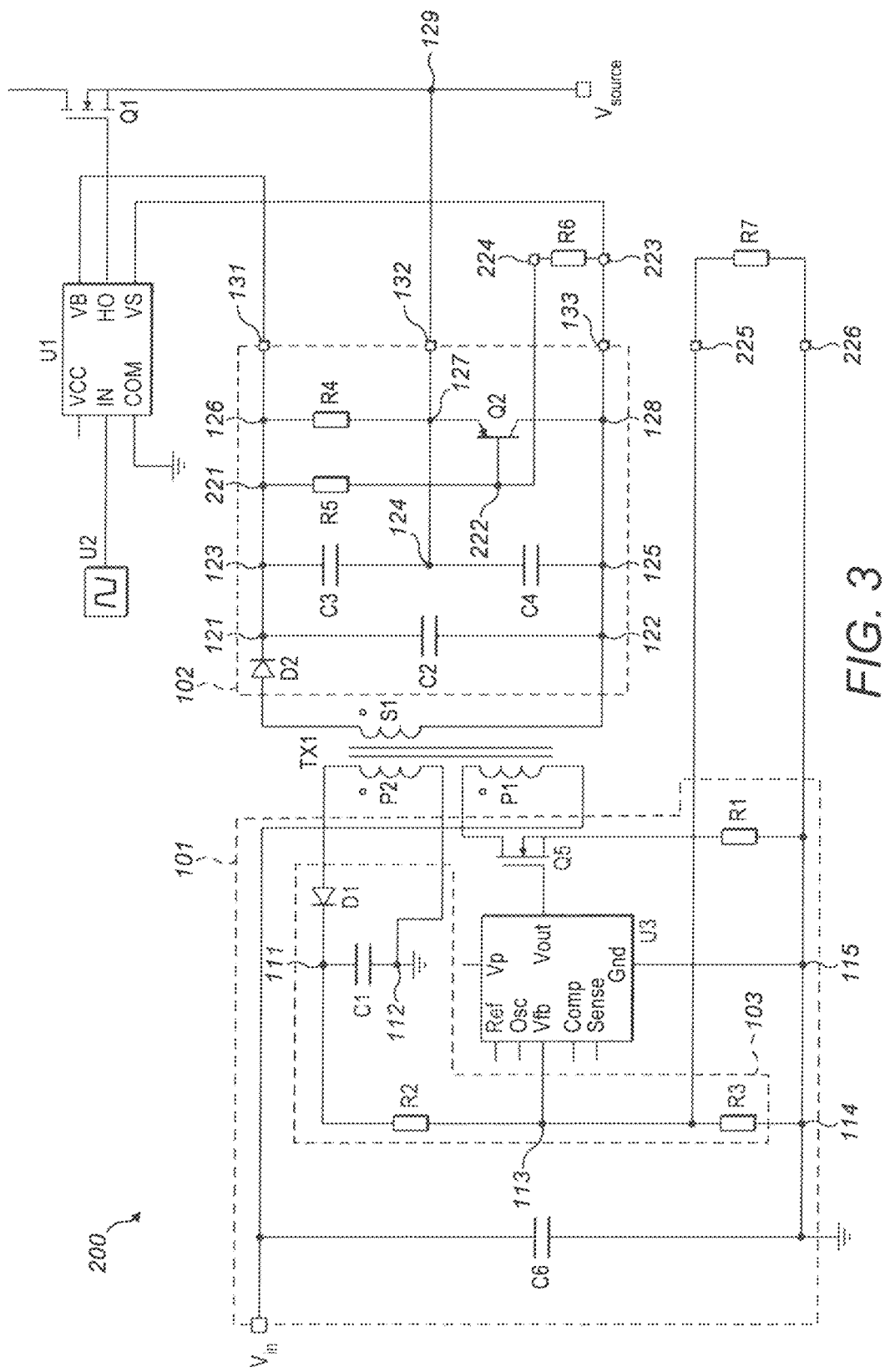
FIG. 3 shows a preferred embodiment of an adjustable power supply that provides adjustable voltages to a gate driver.

FIG. 3 shows a DC to DC flyback converter 200 in accordance with a preferred embodiment of the present invention. In FIG. 3, a PNP transistor Q2 replaces the Zener diode D3 of FIG. 1. A resistive voltage divider R5, R6 is included to adjust the fixed voltages produced at output terminals 131 and 133. Thus, resistive voltage divider R5, R6 acts as a first adjustable circuit as further described below. Preferred embodiments in accordance with the present invention provide an adjustable power supply to a power switch gate driver, as further described below.

The first adjustable circuit shown in FIG. 3 includes resistor R5 and external resistor R6 connected in series across intermediate terminals 121 and 122. As shown in FIG. 3, resistor R5 is connected to intermediate terminal 121 via nodes 221 and 123 and is connected to external resistor R6 via nodes 222 and 224. External resistor R6 is connected to the converter circuit via nodes 223 and 224 and to resistor R5 via node 222.

The base terminal of PNP transistor Q2 is connected to terminal 121 via node 222, resistor R5 and node 221, and connected to terminal 122 via nodes 222 and 224, external resistor R6 and node 223. The emitter terminal of PNP transistor Q2 is also connected to terminal 121 via node 127, resistor R4 and node 126. The emitter terminal is also connected to the source of power switch device Q1 via node 132. The collector terminal of PNP transistor Q2 is connected to terminal 122 via node 128.

In the circuit configuration shown in FIG. 3, node 127 is held at a reference voltage, for example 0 V, and nodes 126 and 128 are held at a constant voltage due to the near-constant emitter-collector voltage drop across the PNP transistor. In one preferred embodiment, node 128 is held at −5 V, for example, by establishing an emitter voltage of approximately 5 V.

The emitter voltage is the sum of the forward biased emitter-base voltage of the transistor, which is approximately 0.6 V, and the voltage at node 222. Therefore, an emitter voltage of 5 V may be set by producing a voltage of approximately 4.4 V at node 222 with respect to node 128.

As node 127 is fixed at a reference voltage of 0 V, node 128 may be held at −5 V by setting voltage divider resistors R5 and R6 to produce a voltage of approximately 4.4 V at node 222 with respect to node 128. Once the voltage at node 222 is set, the emitter voltage, and hence the voltage at node 128, will remain at an approximately constant level even when the voltage across C4 rises.

In other words, resistor R4 and transistor Q2 act as a dividing circuit that divides a potential difference generated across intermediate terminals 121 and 122 into a first output voltage difference applied across output terminals 131 and 132 and a second output voltage difference applied across output terminals 132 and 133. The amount of voltage dropped by transistor Q2 is dependent upon the voltage at node 222, which is adjusted by a first adjustment circuit that includes external resistor R6.

The voltage at node 222 is equal to:

$$V_{222} = V_{C2} \frac{R_6}{R_5 + R_6}$$

where $V_{C2}$ is the potential difference across capacitor C2 or, in other words, the potential difference generated across intermediate terminals 121 and 122.

Therefore, in a specific preferred embodiment, a suitable resistor combination for a 25 V supply which produces 20 V and −5 V at output terminals 131 and 133 could be, for example, R6=4.3 kΩ and R5=20 kΩ.

Adjusting the resistance of resistor R6 affects the ratio with which the voltage applied between intermediate terminals 121 and 122 is divided between resistors R5 and R6, and hence the voltage at node 222. Increasing the resistance of resistor R6 results in an increased voltage at node 222. A larger voltage at node 222 will result in a larger emitter-collector potential difference and hence a larger emitter-collector voltage drop, which adjusts the voltage difference between output terminals 132 and 133 so that a larger negative voltage is produced at output terminal 133. For example, increasing the resistance value of resistor R6 may result in the voltage produced at output terminal 133 increasing from −5 V to −10 V.

Since the potential difference generated between intermediate terminals 121 and 122 is shared between output terminals 131, 132 and 133, adjusting the voltage difference between output terminals 132 and 133 alters the voltage difference produced between output terminals 131 and 132. If the voltage produced at terminal 133 increases, the voltage produced at terminal 131 decreases. In the above example, a voltage increase from −5 V to −10 V at terminal 133 will produce a voltage decrease from +20 V to +15 V at terminal 131.

The supply voltage provided to a power switch device may be adjusted by modify the duty cycle of transistor Q5 using a second adjustment circuit including external resistor R7, as further described below.

As described above with regard to FIGS. 1 and 2, the voltage generated between intermediate terminals 121 and 122 depends upon the duty cycle of transistor Q5, which is regulated by a feedback voltage Vfb at node 113. If, for example, Vfb is reduced so that there is a greater difference between a reference voltage Vref and Vfb, a difference signal Verror will also increase. This results in Vsense being able to linearly increase to a higher level before the RS latch 143 terminates the gate drive signal. Therefore, the duty cycle of PWM switch controller U3 is lengthened, enabling more energy to be stored and transferred to intermediate terminals 121 and 122, and hence to output terminals 131 and 133. Similarly, increasing Vfb results in the duty cycle of PWM switch controller U3 being reduced. Thus, varying the voltage at node 113 modifies the duty cycle of U3 which adjusts the output voltage difference between output terminals 131 and 132 and the output voltage difference between output terminals 132 and 133. Thus, the power supply may be adjusted to supply a power switch device with a variety of supply voltages. For example, a 15 V, 20 V or 25 V supply may be provided to a power switch device.

External resistors R6 and R7 are provided externally to the switching circuitry 101 and converter circuitry 102. External resistor R6 and R7 may be connected to the power supply via external connections or nodes external to the switching or converter circuitry, which enables the resistance of resistors R6 and R7 to be easily adjusted without having to access the power supply circuitry. As shown in FIG. 3, resistor R6 may be connected to the converter circuitry via nodes 223 and 224 and resistor R7 may be connected to the switching circuitry via nodes 225 and 226. Nodes 223, 224, 225 and 226 may be provided external to the adjustable power supply. This enables resistors R6 and R7 to be adjusted without requiring access to the power supply circuitry.

Adjusting the resistance of resistor R7 affects the feedback voltage at node 113, which in turn adjusts the magnitude of the potential difference appearing across intermediate terminals 121 and 122, thereby allowing the output voltage to be supplied to the power switch gate driver to be adjusted. Resistor R7 defines a portion of the feedback resistive voltage divider along with feedback circuit resistors R2 and R3. Increasing the resistance of resistor R7 increases the voltage level at node 113. As described above, if the voltage at node 113 increases such that the difference between Vfb and a reference voltage Vref is reduced, the duty cycle of PWM switch controller U3 is adjusted to reduce the voltage applied across intermediate terminals 121 and 122.

It should be noted that for some fixed output non-regulated power supply topologies, such as the Royer circuit, the voltage supplied to intermediate terminals 121 and 122 may be simply adjusted by varying the input voltage.

Hence, adjusting the resistance of external resistors R6 and R7 enables the converter to provide an adjustable output voltage potential difference to a load and also enables the converter to provide a wide range of positive and negative voltages at output terminals 131 and 133. The preferred embodiments of the present invention are therefore able to advantageously provide the voltage requirements for many switch variants using only a single power supply. Products embodying the preferred embodiments of the present invention therefore reduce the qualification time, reducing qualifications costs and being able to accommodate future developments.

Figure 4:
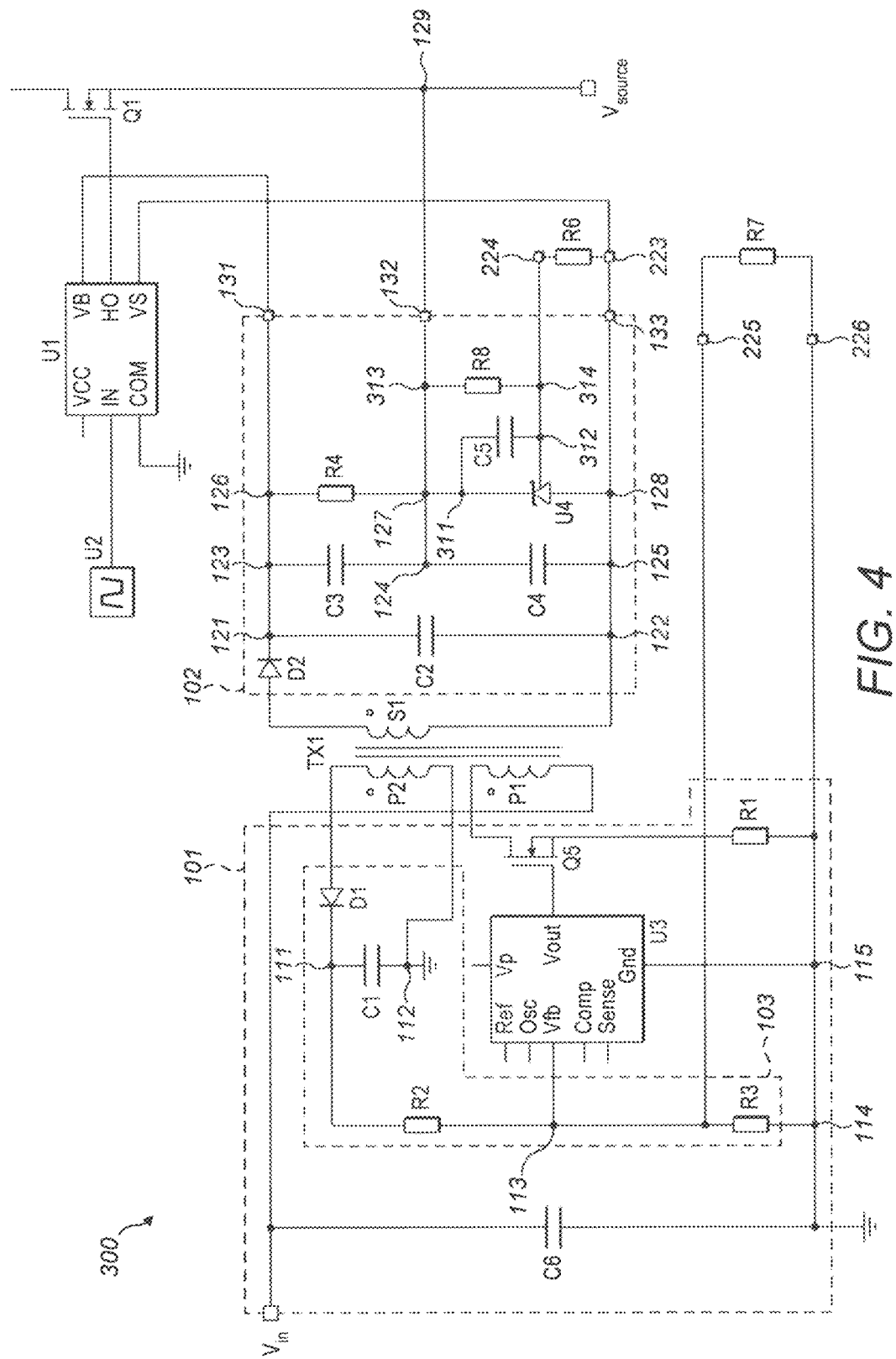
FIG. 4 shows an alternative preferred embodiment of an adjustable power supply that provides adjustable voltages to a gate driver.

FIG. 4 shows a DC to DC flyback converter 300 in accordance with an alternative preferred embodiment of the present invention where the Zener diode D3 of FIG. 1 is replaced by a reference integrated circuit U4. The above advantages associated with the preferred embodiment shown in FIG. 3 are also present for the alternative preferred embodiment shown in FIG. 4.

In the preferred embodiment of FIG. 4, capacitor C3, capacitor C4, resistor R4 and reference integrated circuit U4 are connected to define a capacitive voltage divider and a resistive voltage divider. As before in FIG. 4, node 127 is held at a reference voltage of 0 V and connected to the source terminal of power switch device Q1 via node 129. Compensation capacitor C5 is connected to the integrated circuit cathode pin via node 311 and the Vref pin via node 312. The compensation capacitor is included to stabilize the integrated circuit U4.

The potential difference generated across intermediate terminals 121 and 122 is divided into a first output voltage difference applied across output terminals 131 and 132 and a second output voltage difference applied across output terminals 132 and 133 in accordance with the resistances of resistors R4, R6 and R8. Resistor R8 is an internal resistor connected to the integrated circuit cathode pin via nodes 313 and 127 and the integrated circuit Vref pin via nodes 314 and 312. Resistor R6 is an external resistor connected to the integrated circuit anode pin via node 223, output terminal 133 and node 128 and connected to the Vref pin via nodes 224, 314 and 312.

Resistors R4, R8 and R6 define an adjustment circuit whereby the voltage at node 314 is held at a reference voltage provided by the integrated circuit at the Vref pin. In a specific preferred embodiment, the integrated circuit may be a shunt regulator. For example, shunt regulator TL431 may be used to hold output terminal 133 at −5 V. Since shunt regulator TL431 maintains a voltage drop of approximately 2.5 V between nodes 313 and 314, the value of external resistor R6 may be selected to determine the fixed voltages at output terminals 131 and 133. For example, if the resistance of R6 matches that of R8, the voltage drop across R6 will equal that of the voltage drop across R8. As node 314 is held at approximately −2.5 V by U4 the voltage at node 223, and hence at node 133, will be held at −5 V. The remaining voltage will be distributed across R4. For example, if a potential difference of 25 V is applied between intermediate terminals 121 and 122, holding output terminal 133 at −5 V will ensure output terminal 131 is held at +20 V.

As before, adjusting the value of external resistor R6 will affect how the potential difference between intermediate terminals 121 and 122 is divided between output terminals 131 and 133. Resistor R6 may be adjusted externally to the power supply with the advantages described above in relation to FIG. 3, namely providing adjustable output voltages to power switch device Q1.

As also described above in relation to FIG. 3, adjusting external resistor R7 adjusts the duty cycle of the PWM switch controller U3 such that the potential difference between intermediate terminals 121 and 122 may be adjusted. For example, in one preferred embodiment, the power supply output may range from 20 V to 30 V.

Figure 5:
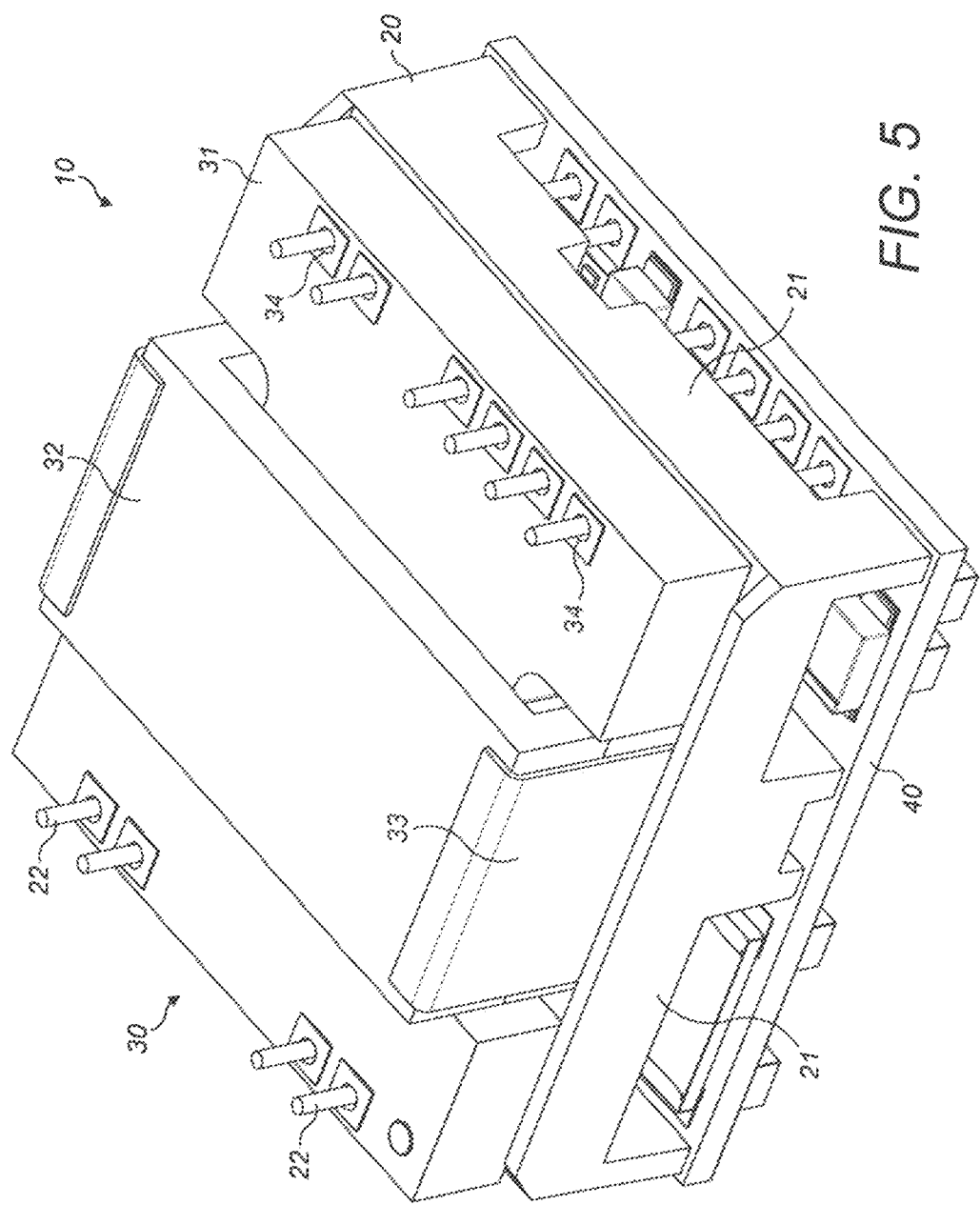
FIG. 5 shows a power supply unit including a header, planar transformer, and printed circuit board mounted in position.

FIG. 5 illustrates an example of a power supply unit 10 which may include the power supply circuitry described above. The power supply unit 10 includes a header 20, a planar transformer 30 and a main Printed Circuit Board (PCB) 40. As can be seen in FIG. 5, the header 20 includes a plurality of side walls 21 and electrical connectors 22, passing from the top of the header 20 to the bottom side and providing both mechanical and electrical connections by which the planar transformer 30 and the main PCB 40 are connected to the header 20 and to each other. The main PCB 40 may be mounted onto a third party PCB or motherboard (not shown).

Planar transformer 30 includes a substrate 31 and a surrounding magnetic core 32. The magnetic core may be made of a ferrite material for example, and may be secured in place in the header 20 by clips 33. The substrate 31 is typically a single piece of resin-like material that passes through the magnetic core 32 from an input side to an output side.

Substrate 31 contains transformer windings P1, P2 and S1 located in its interior surrounded by the magnetic core 32. In the example shown, the transformer windings arrangement includes a winding axis that is perpendicular or substantially perpendicular within manufacturing tolerances to the top and bottom surface of the substrate to thereby define the windings of the planar transformer. The coil arrangement includes primary coil windings P1, P2 connected to the input or primary side connectors 22 of the header 20 by traces (not shown), and secondary coil windings S1 connected to the output or secondary side connectors 22 of the header 20 by traces (not shown). The connectors 22 may pass through the substrate 31 at plated via holes 34. The plated via holes 34 and the connectors 22 thread through the substrate 31 from one side of the substrate 31 to the other.

Main PCB 40 includes switching circuitry 101 that controls the transformer and converter circuitry 102 that converts a generated potential difference into three fixed voltages. The components described above in relation to the switching circuitry 101 and converter circuitry 102 may be mounted above and/or below the main PCB 40.

Main PCB 40 also includes surface mount feet (not shown) that connects to PCB lands on the third party PCB. In a preferred embodiment, the external connectors 223, 224, 225 and 226 are main PCB 40 surface mount feet which are connected to first and second external resistors located on the third party PCB.

The external connectors 223, 224, 225 and 226 and external resistors R6, R7 are therefore external to the header 20, switching circuitry 101 and converter circuitry 102. Providing connectors 223, 224, 225 and 226 external to the header 20, switching circuitry 101, and converter circuitry 102 enables external resistors R6 and R7 to be adjusted without requiring access to the switching or converter circuitry mounted on the main PCB 40 within the header 20. A consumer may therefore adjust the voltages provided to a power switch gate driver in a simple manner without requiring access to the circuitry located within the power supply unit.

The preferred embodiments described above are not limited to power supplies for IGBT, SIC, MOS, and GaN power switches and may readily be used in other power switching technologies. Additionally, the above described technique of adjusting the division of voltage across two outputs can be applied to any power supply topology including, but not limited to, flyback, forward converter, Half bridge, Full bridge, Push Pull, Buck, Boost, Sepic, Cuk or Zeta circuit configurations.

Various modifications to the preferred embodiments described above are possible and will occur to those skilled in the art without departing from the scope of the present invention which is defined by the following claims.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

The invention claimed is:

1. An adjustable power supply device for supplying power to a power switch control device configured to provide control signals to a power switch device, the adjustable power supply device comprising:
a pair of input terminals;
switching circuitry connected to the pair of input terminals;
converter circuitry, the converter circuitry including a pair of intermediate terminals and first, second, and third output terminals that output power to the power switch control device;
a transformer including a primary side winding coupled to the pair of input terminals and a secondary side winding coupled to the pair of intermediate terminals; wherein
a potential difference generated between the pair of intermediate terminals is divided by a dividing circuit into a first output voltage difference applied across the first and the second output terminals and a second output voltage difference applied across the second and the third output terminals;
the converter circuitry including a first adjustment circuit that adjusts the first output voltage difference and the second output voltage difference, the first adjustment circuit including at least one external terminal that is coupled to a first external resistance element that is external to the converter circuitry, wherein a change in a resistance value of the first resistance element adjusts the first output voltage difference and the second output voltage difference;
the switching circuitry including a second adjustment circuit that adjusts the potential difference generated between the pair of intermediate terminals, the second adjustment circuit including at least one external terminal that is coupled to a second external resistance element that is external to the switching circuitry, wherein a change in a resistance value of the second resistance element adjusts the potential difference between the pair of intermediate;
the second output terminal is held at a reference voltage;
the first output terminal provides the first output voltage difference to a first input of the power switch control device; and
the third output terminal provides the second output voltage difference to a second input of the power switch control device.

2. The adjustable power supply device of claim 1, wherein the switching circuitry further includes a switch controller coupled to a switch and coupled to the primary side winding to control a current flowing through the primary side winding.

3. The adjustable power supply device of claim 2, wherein one of the at least one external terminals of the second adjustment circuit is coupled to the switch controller.

4. The adjustable power supply device of claim 3, wherein the one of the at least one external terminals of the second adjustment circuit is coupled to a voltage feedback pin of the switch controller.

5. The adjustable power supply device of claim 4, wherein the voltage feedback pin of the switch controller is coupled to a primary side feedback winding.

6. The adjustable power supply device of claim 5, wherein the second adjustment circuit includes a switching circuit voltage divider including at least a first resistor connected between the voltage feedback pin and the primary side feedback winding, and a second resistor connected between the voltage feedback pin and ground; and
the voltage feedback pin of the switch controller is connected to the switching circuit voltage divider.

7. The adjustable power supply device of claim 6, wherein the second adjustment circuit includes a pair of external terminals that is coupled to a pair of corresponding external connections configured to receive the first external resistance element therebetween,
one of the pair of external terminals is coupled to ground, and
the second external resistance element, when connected between the pair of corresponding external connections, is coupled via the pair of external terminals of the second adjustment circuit in parallel with the second resistor in the switching circuit voltage divider.

8. The adjustable power supply device of claim 7, wherein the second adjustment circuit adjusts the potential difference generated between the pair of intermediate terminals by adjusting a duty cycle provided by the switch controller to the switch.

9. The adjustable power supply device of claim 1, wherein the dividing circuit includes a further resistance element.

10. The adjustable power supply device of claim 1, wherein one of the at least one external terminals of the first adjustment circuit is coupled to a low voltage side of the secondary side winding via one of the pair of intermediate terminals.

11. The adjustable power supply device of claim 10, wherein the first adjustment circuit includes a converter circuitry voltage divider including at least a first resistor and a second resistor connected in parallel between the pair of intermediate terminals.

12. The adjustable power supply device of claim 11, wherein
the at least one external terminal of the first adjustment circuit includes a pair of external terminals; and
the pair of external terminals of the first adjustment circuit is coupled to a pair of external connections configured to receive the first external resistance element mounted therebetween.

13. The adjustable power supply device of claim 12, wherein
the dividing circuit includes a further resistance element; and
one of the pair of external terminals of the first adjustment circuit is coupled to the dividing circuit and to a high voltage side of the secondary side winding via the other of the pair of intermediate terminals and the converter circuitry voltage divider, such that the first external resistance element is coupled to the further resistance element of the dividing circuit.

14. The adjustable power supply device of claim 13, wherein the further resistance element is a transistor.

15. The adjustable power supply device of claim 14, wherein the other of the pair of external terminals of the first adjustment circuit is coupled to a collector terminal of the transistor.

16. The adjustable power supply device of claim 15, wherein the transistor is connected in parallel between the pair of intermediate terminals such that a emitter terminal of the transistor is coupled to the high voltage side of the secondary side winding.

17. The adjustable power supply device of claim 9, wherein the further resistance element includes an adjustable voltage drop.

18. The adjustable power supply device of claim 17, wherein a node of the first adjustment circuit is connected to the further resistance element such that a change in voltage at the node adjusts a voltage dropped across the further resistance element.

19. The adjustable power supply device of claim 18, wherein the first adjustment circuit adjusts the first output voltage difference and the second output voltage difference by adjusting the voltage dropped across the further resistance element.

\* \* \* \* \*